US012813117B2

(12) United States Patent
Lee et al.

(10) Patent No.: US 12,813,117 B2
(45) Date of Patent: Nov. 24, 2026

(54) ORGANIC LIGHT-EMITTING DISPLAY DEVICE

(71) Applicant: LG Display Co., Ltd., Seoul (KR)

(72) Inventors: Seongku Lee, Seoul (KR); KangIl Kim, Seoul (KR); Kihyung Lee, Yongin-si (KR); Seongkwang Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 394 days.

(21) Appl. No.: 18/489,082

(22) Filed: Oct. 18, 2023

(65) Prior Publication Data

US 2024/0224680 A1 Jul. 4, 2024

(30) Foreign Application Priority Data

Dec. 30, 2022 (KR) ........................ 10-2022-0191173

(51) Int. Cl.
*H10K 59/131* (2023.01)
*H10K 59/122* (2023.01)
(Continued)

(52) U.S. Cl.
CPC ....... *H10K 59/1315* (2023.02); *H10K 59/122* (2023.02); *H10K 59/124* (2023.02); *H10K 59/131* (2023.02); *H10K 59/88* (2023.02)

(58) Field of Classification Search
CPC .. H10K 59/122; H10K 59/124; H10K 59/131; H10K 59/1315
See application file for complete search history.

(56) References Cited

U.S. PATENT DOCUMENTS 10,050,223 B2 8/2018 Im et al.
10,403,845 B2 9/2019 Lee et al.
(Continued)

FOREIGN PATENT DOCUMENTS

KR 10-2017-0026014 A 3/2017
KR 10-2018-0013225 A 2/2018
(Continued)

OTHER PUBLICATIONS

Machine-provided English translation of KR 20180013225 (KR document published Feb. 7, 2018) (Year: 2018).*
(Continued)

*Primary Examiner* — Kevin Parendo
(74) *Attorney, Agent, or Firm* — Fenwick & West LLP

(57) ABSTRACT

An organic light-emitting display device includes: an auxiliary line disposed between a plurality of sub-pixels, an auxiliary line connection part connected to the auxiliary line, a passivation layer disposed on the auxiliary line connection part and configured to expose a part of the auxiliary line connection part in a contact area, an interlayer insulation layer disposed between the auxiliary line and the passivation layer. The auxiliary line connection part includes: a first auxiliary line connection part disposed below the interlayer insulation layer and connected to the auxiliary line, and a second auxiliary line connection part disposed between the interlayer insulation layer and the passivation layer and connected to the first auxiliary line connection part. A cathode electrode of each of the plurality of organic light-emitting elements disposed on the plurality of sub-pixels is in contact with the auxiliary line connection part in the contact area.

8 Claims, 17 Drawing Sheets

(51) Int. Cl.
*H10K 59/124* (2023.01)
*H10K 59/88* (2023.01)

(56) References Cited

U.S. PATENT DOCUMENTS

| | | | |
|---|---|---|---|
| 10,454,060 | B2 | 10/2019 | Im et al. |
| 2017/0062755 | A1 | 3/2017 | Im et al. |
| 2018/0097047 | A1 | 4/2018 | Jung et al. |
| 2018/0315950 | A1 | 11/2018 | Im et al. |
| 2019/0198799 | A1 | 6/2019 | Lee et al. |
| 2021/0202667 | A1 | 7/2021 | Kim et al. |
| 2022/0209209 | A1 | 6/2022 | Son et al. |

FOREIGN PATENT DOCUMENTS

| | | | |
|---|---|---|---|
| KR | 10-2018-0036434 | A | 4/2018 |
| KR | 10-2019-0079265 | A | 7/2019 |
| KR | 10-2021-0083989 | A | 7/2021 |
| KR | 10-2022-0096089 | A | 7/2022 |

OTHER PUBLICATIONS

Intellectual Property Office of the United Kingdom, Combined Search and Examination Report, United Kingdom Patent Application No. GB2316438.7, Apr. 11, 2024, seven pages.

* cited by examiner

ORGANIC LIGHT-EMITTING DISPLAY DEVICE

CROSS-REFERENCE TO RELATED APPLICATION

This application claims the priority of Republic of Korea Patent Application No. 10-2022-0191173 filed on Dec. 30, 2022, in the Korean Intellectual Property Office, the disclosure of which is incorporated herein by reference in its entirety.

BACKGROUND

Field

The present specification relates to an organic light-emitting display device, and more particularly, to an organic light-emitting display device that reduces resistance of a cathode electrode through an auxiliary power line.

Description of the Related Art

A field of organic light-emitting display devices, which visually display electrical information signals, has been rapidly developed. Studies are being continuously conducted to develop various types of organic light-emitting display devices which are thin and lightweight, consume a small amount of power, and have improved performance.

An electroluminescent organic light-emitting display device, which is representative of the organic light-emitting display device, is an organic light-emitting display device that autonomously emits light. The electroluminescent organic light-emitting display device does not require a separate light source and thus may be manufactured as a lightweight, thin display device. In addition, the electroluminescent organic light-emitting display device is advantageous in terms of power consumption because the electroluminescent organic light-emitting display device operates at a low voltage. Further, the electroluminescent organic light-emitting display device is also excellent in implementation of colors, response speeds, viewing angles, and contrast ratios (CRs).

The organic light-emitting display devices are classified into a top emission type organic light-emitting display device and a bottom emission type organic light-emitting display device depending on a transmission direction of light emitted by the organic light-emitting element. The bottom emission type organic light-emitting display device has a problem in that an aperture ratio is degraded by a circuit element because the circuit element is positioned between a light-emitting layer and an image display surface. In contrast, the top emission type organic light-emitting display device is advantageous in that an aperture ratio is improved because a circuit element is not positioned between a light-emitting layer and an image display surface.

In the case of the top emission type organic light-emitting display device, light emitted from an organic light-emitting layer of an organic light-emitting element propagates through a cathode electrode, and thus the cathode electrode is formed by using a transparent conductive material. For this reason, there is a problem in that resistance of the cathode electrode increases.

SUMMARY

An object to be achieved by the present disclosure is to provide an organic light-emitting display device in which a cathode electrode of an organic light-emitting element is connected to an auxiliary line, such that resistance of the cathode electrode is reduced, and a contact structure between the cathode electrode and the auxiliary line is improved.

Objects of the present disclosure are not limited to the above-mentioned objects, and other objects, which are not mentioned above, can be clearly understood by those skilled in the art from the following descriptions.

According to an example of the present disclosure, an organic light-emitting display device includes: a substrate having a display area including a plurality of sub-pixels, and a non-display area: an auxiliary line provided on the substrate and disposed between the plurality of sub-pixels: an auxiliary line connection part connected to the auxiliary line: a passivation layer disposed on the auxiliary line connection part and configured to expose a part of the auxiliary line connection part in a contact area: an interlayer insulation layer disposed between the auxiliary line and the passivation layer: a planarization layer disposed on the passivation layer and having an end that further protrudes toward the contact area than an end of the passivation layer; and a plurality of organic light-emitting elements provided on the planarization layer and disposed on the plurality of sub-pixels. The auxiliary line connection part includes: a first auxiliary line connection part disposed below the interlayer insulation layer and connected to the auxiliary line; and a second auxiliary line connection part disposed between the interlayer insulation layer and the passivation layer and connected to the first auxiliary line connection part, and a cathode electrode of each of the plurality of organic light-emitting elements may be in contact with the auxiliary line connection part in the contact area.

Other detailed matters of the exemplary embodiments are included in the detailed description and the drawings.

The present specification may provide a low-power organic light-emitting display device in which the cathode electrode of the organic light-emitting element may be connected to the auxiliary line, and the contact area between the cathode electrode and the auxiliary line may be expanded, such that the contact resistance and current density are reduced.

The present specification may provide the stable undercut structure by optimizing the process, such as a cleaning process, by applying the undercut structure using the planarization layer to the area in which the cathode electrode and the auxiliary electrode are in contact with each other.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
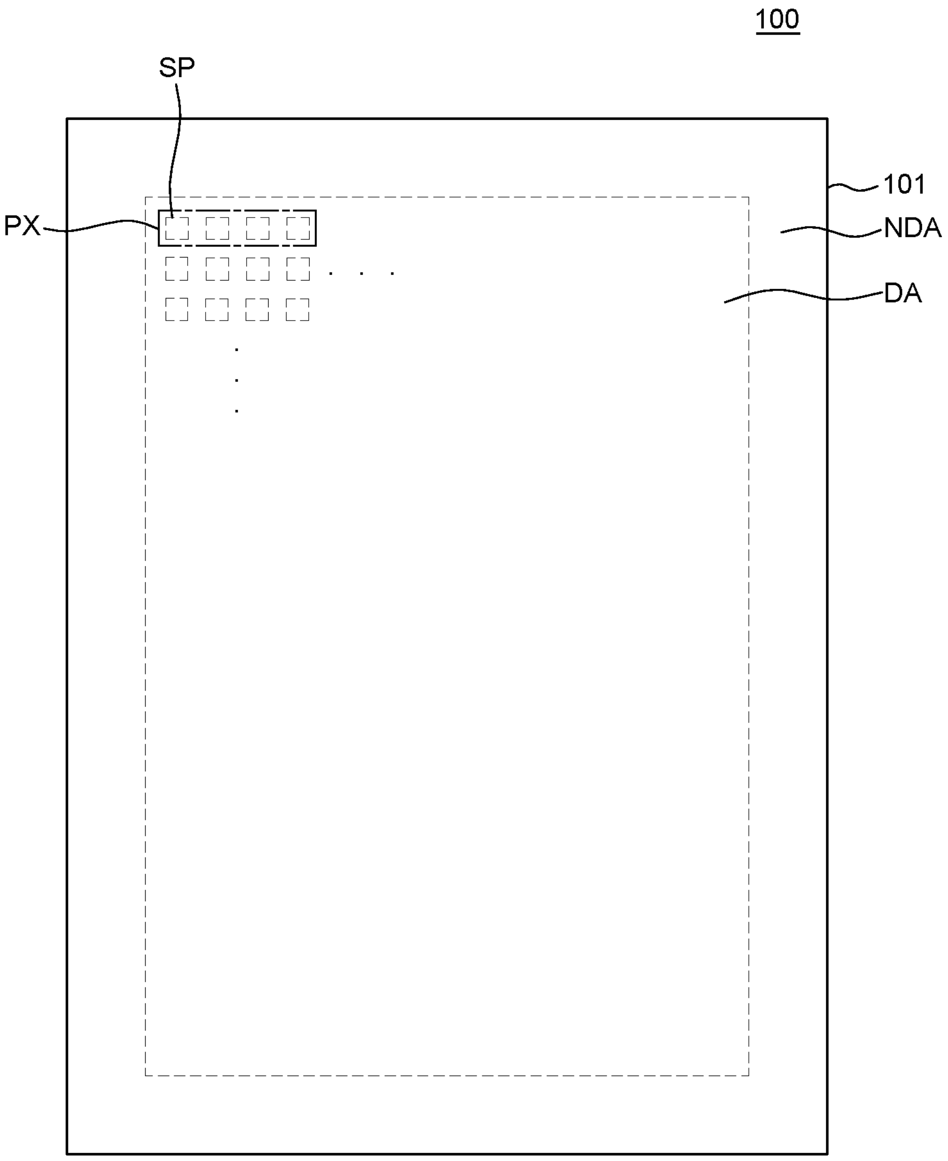
FIG. 1 is a schematic top plan view of an organic light-emitting display device according to an exemplary embodiment of the present specification.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is disposed "on" another element or layer, another layer or another element may be interposed directly on the other element or therebetween. This also applies when a feature or features are described as being "sequentially disposed", there may be other features between the sequentially disposed features.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Figure 2:
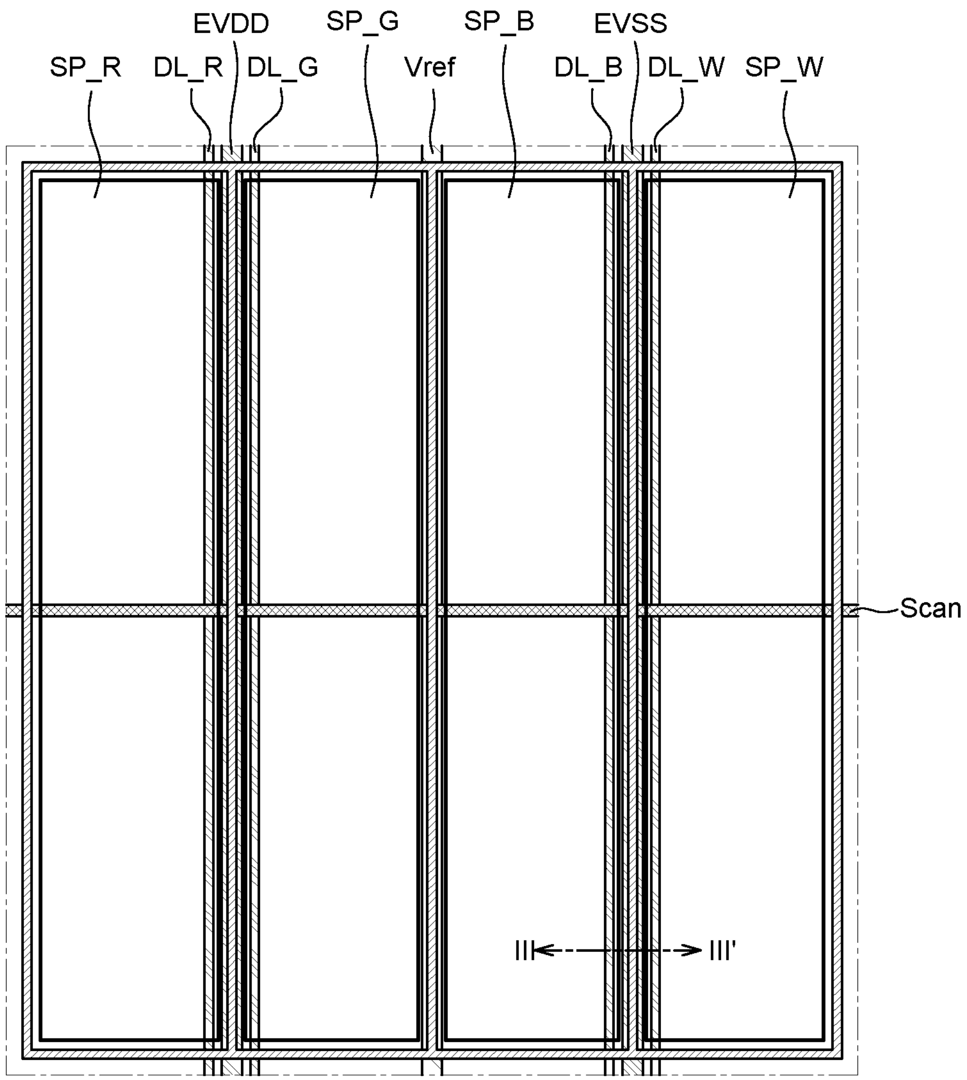
FIG. 2 is a top plan view for explaining a contact structure between a cathode electrode and an auxiliary line of the organic light-emitting display device according to the exemplary embodiment of the present specification.
Figure 3:
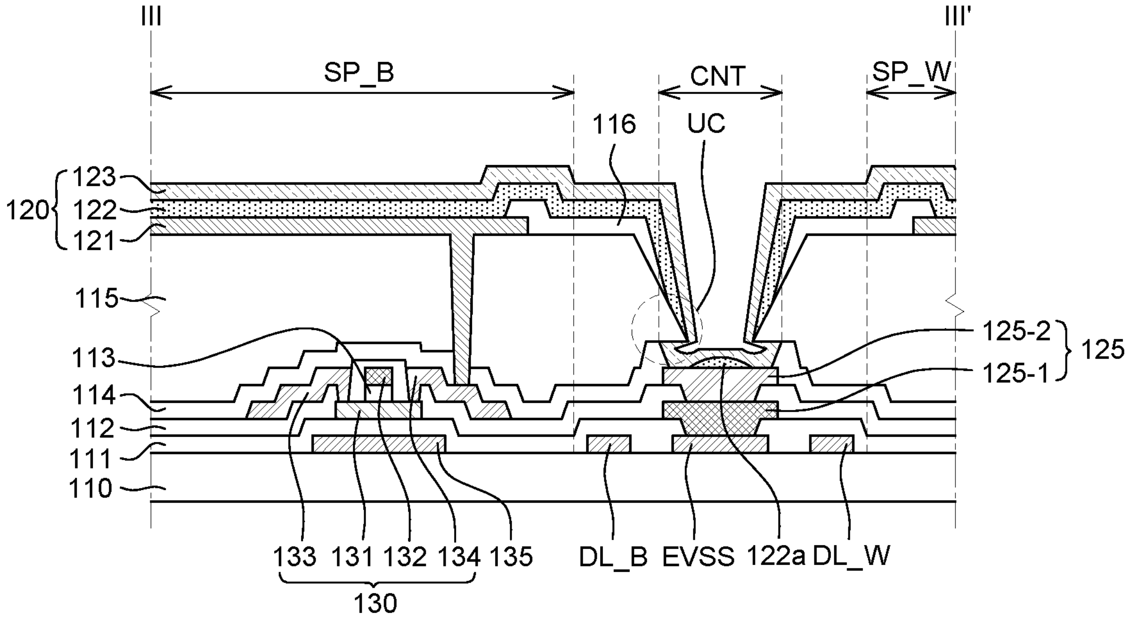
FIG. 3 is a cross-sectional view taken along line III-III' in FIG. 2 according to an exemplary embodiment of the present specification.

FIG. 1 is a schematic top plan view of an organic light-emitting display device according to an exemplary embodiment of the present specification. FIG. 2 is a top plan view for explaining a contact structure between a cathode electrode and an auxiliary line of the organic light-emitting display device according to the exemplary embodiment of the present specification. FIG. 3 is a cross-sectional view taken along line III-III' in FIG. 2.

With reference to FIG. 1, an organic light-emitting display device 100 according to an exemplary embodiment of the present specification includes a display panel 101 having a display element configured to display images, a driving element configured to operate the display element, and lines configured to transmit various types of signals to the display element and the driving element.

The display elements may have different configurations depending on the type of display panel 101. In the exemplary embodiment of the present specification, an example in which the display panel 101 is an organic light-emitting display panel is described. In this case, the display element may be an organic light-emitting element including an anode electrode, an organic light-emitting layer, and a cathode electrode. That is, the organic light-emitting display device 100 according to the exemplary embodiment of the present specification may be an organic light-emitting display device in which a light-emitting element is implemented as an organic light-emitting diode (OLED). As another example, the organic light-emitting display device 100 may be an inorganic light-emitting display device in which a light-emitting element is implemented as a light-emitting diode made of an inorganic material. As still another example, the organic light-emitting display device 100 may be a quantum dot display device implemented by quantum dots, which are semiconductor crystals, so that a light-emitting element autonomously emits light. In addition, the organic light-emitting display device 100 according to the exemplary embodiment of the present specification may be a flexible organic light-emitting display device.

The display panel 101 may include a substrate, and a plurality of insulating films, transistor layers, and light-emitting element layers disposed on the substrate.

To display images, the display panel 101 may include a plurality of sub-pixels SP, and various types of signal lines configured to operate the plurality of sub-pixels SP. The signal lines may include a plurality of data lines, a plurality of gate lines, a plurality of power lines, and the like.

The plurality of data lines and the plurality of gate lines, which are disposed on the display panel 101, may intersect each other. The plurality of data lines may each be disposed while extending in a first direction. The plurality of gate lines may each be disposed while extending in a second direction. In this case, the first direction may be considered to be a column (or y) direction, and the second direction may be considered to be a row (or x) direction. Alternatively, the first direction may be a row direction, and the second direction may be a column direction.

As illustrated in FIG. 1, the display panel 101 includes a display area DA, which displays images, and a non-display area NDA, which does not display images.

A plurality of pixels PX may be disposed in the display area DA. The plurality of sub-pixels SP, which constitute a pixel PX, may be disposed in the display area DA. A pixel circuit configured to operate the plurality of sub-pixels SP may be disposed in the display area DA. The sub-pixels SP may each include a transistor positioned on a transistor layer, and a light-emitting element positioned on a light-emitting element layer. The sub-pixel SP is a minimum unit that constitutes the display area DA. That is to say that the sub-pixel is considered to be the smallest unit of the display area DA. The display element may be disposed on each of the plurality of sub-pixels SP. The pixel circuit configured to operate the plurality of sub-pixels SP may include a thin-film transistor, a storage capacitor, a gate line, a data line, and the like. However, the present disclosure is not limited thereto.

The non-display area NDA may be bent, such that the non-display area NDA is not visible from a front surface. The non-display area NDA may be covered by a casing (not illustrated). The non-display area NDA is called a bezel area.

Various lines and circuits for operating the organic light-emitting element in the display area DA may be disposed in the non-display area NDA. For example, the non-display area NDA may include link lines for transmitting signals to the plurality of sub-pixels and the circuit in the display area DA. The non-display area NDA may include gate-in-panel (GIP) lines or driver ICs such as gate driver ICs and data driver ICs. However, the present disclosure is not limited thereto.

For example, the non-display area NDA may include a ground line disposed to surround the display area DA and configured to apply a common voltage to the sub-pixel. For example, one or two or more ground lines may be formed. In case two or more ground lines are provided, the ground line, which is positioned to be closer to the display area DA, may be called an inner ground line.

In addition, although not illustrated, the organic light-emitting display device 100 may include a touch detection part including a plurality of touch electrodes. A touch routing line for transmitting a touch signal may be disposed on each of the plurality of touch electrodes.

In addition, the organic light-emitting display device 100 may further include various additional elements configured to generate various signals or operate the pixel in the display area DA. The additional elements for operating the pixel may include an inverter circuit, a multiplexer, an electro-static discharge (ESD) circuit, and the like.

In addition, the organic light-emitting display device 100 may also include an additional element related to a function in addition to a function of operating the pixel PX. For example, the organic light-emitting display device 100 may further include additional elements that provide a touch detection function, a user certification function (e.g., finger-print recognition), a multi-level pressure detection function, a tactile feedback function, and the like. The above-mentioned additional elements may be positioned in the non-display area NDA and/or an external circuit connected to a connection interface.

In addition, the organic light-emitting display device 100 may include display drive circuits for operating the display panel 101. The display drive circuits may include a data drive circuit, a gate drive circuit, a display controller, and the like.

The data drive circuit may be a circuit for operating the plurality of data lines and output data signals to the plurality of data lines. The gate drive circuit may be a circuit for operating the plurality of gate lines and output gate signals to the plurality of gate lines.

The display controller may be a device for controlling the data drive circuit and the gate drive circuit and controlling driving timing for the plurality of data lines and driving timing for the plurality of gate lines.

The display controller may supply a data driving control signal to the data drive circuit to control the data drive circuit and supply a gate driving control signal to the gate drive circuit to control the gate drive circuit.

The display controller may receive input image data from a host system and supply image data to the data drive circuit on the basis of the input image data.

The data drive circuit may supply data signals to the plurality of data lines on the basis of driving timing control of the display controller. The data drive circuit may receive digital image data from the display controller, convert the received image data into analog data signals, and output the analog data signals to the plurality of data lines.

The gate drive circuit may supply gate signals to the plurality of gate lines on the basis of timing control of the display controller. The gate drive circuit may generate gate signals by receiving a first gate voltage, which corresponds to a turn-on level voltage, and a second gate voltage, which corresponds to a turn-off level voltage, together with various types of gate driving control signals and supply the generated gate signals to the plurality of gate lines.

The gate drive circuit supplies the gate signal to the gate line in response to the gate driving control signal supplied from the display controller. The gate drive circuit may be disposed at one side or two opposite sides of the display panel 101 in a gate-in-panel (GIP) manner.

The gate drive circuit sequentially outputs the gate signals to the plurality of gate lines under the control of the display controller. The gate drive circuit may shift the gate signals by using a shift register and sequentially supply the signals to the gate lines.

In the organic light-emitting display device 100, the gate signals may include a scan signal and a light-emitting control signal. A scan signal pulse is synchronized with the data voltage and selects the sub-pixels SP on the line to which data is written. The light-emitting control signal defines light-emitting time of each of the sub-pixels SP.

At least one of the data drive circuit and the gate drive circuit may be disposed in the display area DA of the display panel 101. For example, at least one of the data drive circuit and the gate drive circuit may be disposed so as not to overlap the sub-pixels SP or disposed to overlap some or all of the sub-pixels SP.

In addition, the organic light-emitting display device 100 may further include a power supply circuit configured to supply various types of power to the display drive circuit and/or the touch sensing circuit.

FIG. 2 is an enlarged view of the sub-pixels SP that constitute at least one pixel PX among the plurality of sub-pixels SP disposed in the display area DA of the display panel 101 in FIG. 1. For example, the plurality of sub-pixels SP illustrated in FIG. 2 may include a red sub-pixel SP_R configured to emit red light, a green sub-pixel SP_G configured to emit green light, a blue sub-pixel SP_B configured to emit blue light, and a white sub-pixel SP_W configured to emit white light.

With reference to FIG. 2, data lines DL_R, DL_G, DL_B, and DL_W, a high-potential voltage supply line EVDD, a low-potential voltage supply line EVSS, and a reference voltage supply line Vref, which extend in the first (column, y) direction, are disposed between the plurality of sub-pixels SP. The data line DL_R is a data line for providing a data signal to the red sub-pixel. The data line DL_G is a data line for providing a data signal to the green sub-pixel. The data line DL_B is a data line for providing a data signal to the blue sub-pixel SP_B, and the data line DL_W is a data line for providing a data signal to the white sub-pixel SP_W.

In addition, a gate line Scan, which extends in the second (row, x) direction, may be disposed between the plurality of sub-pixels SP. The gate line Scan may provide gate signals to the red sub-pixel, the green sub-pixel, the blue sub-pixel, and the white sub-pixel.

Hereinafter, an example will be described in which the high-potential voltage supply line EVDD, which extends in a vertical (first, column, row) direction, is disposed between the red sub-pixel SP_R and the green sub-pixel SP_G, and the low-potential voltage supply line EVSS is disposed between the blue sub-pixel SP_B and the white sub-pixel SP_W, as illustrated in FIG. 2. However, the arrangement positions of the high-potential voltage supply line EVDD and the low-potential voltage supply line EVSS may be changed to each other.

The organic light-emitting display device 100 according to the exemplary embodiment of the present specification may be a top emission type display device. In the top emission type display device, a transparent cathode electrode, which applies a common voltage to a light-emitting layer of an organic light-emitting element, may be used. Because the transparent cathode electrode has a high resistance value, the organic light-emitting display device 100 according to the exemplary embodiment of the present specification may provide uniform resistance of the cathode electrode over the entire display area DA by means of contact between the cathode electrode and the auxiliary line (EVSS of FIG. 2).

A contact structure between the cathode electrode and the auxiliary line disposed between the blue sub-pixel SP_B and the white sub-pixel SP_W in FIG. 2 will be described in detail with reference to FIG. 3.

With reference to FIG. 3, in an area of the blue sub-pixel SP_B of the display panel 101, a transistor layer is formed on a substrate 110. An active layer 131, a gate insulating film 113, a gate electrode 132, and an interlayer insulation layer 112 are sequentially disposed on the transistor layer. A source electrode 133 and a drain electrode 134, which are electrically connected to the active layer 131, are disposed on the interlayer insulation layer 112. In this case, the active layer 131, the gate electrode 132, the source electrode 133, and the drain electrode 134 may constitute a driving transistor 130 that operates the sub-pixel SP.

The active layer 131 may be made of polycrystalline silicon (p-Si), amorphous silicon (a-Si), or an oxide semiconductor. However, the present disclosure is not limited thereto. The gate insulating film 113 may be made of silicon oxide (SiOx), silicon nitride (SiNx), or a multilayer thereof. However, the present disclosure is not limited thereto. The gate electrode 132 may be made of, but not limited to, various electrically conductive materials, for example, magnesium (Mg), aluminum (Al), nickel (Ni), chromium (Cr), molybdenum (Mo), tungsten (W), gold (Au), or an alloy thereof. The source electrode 133 and the drain electrode 134 may each include a single layer or multilayer made of various electrically conductive materials, for example, magnesium (Mg), aluminum (Al), nickel (Ni), chromium (Cr), molybdenum (Mo), tungsten (W), gold (Au), or an alloy thereof. However, the present disclosure is not limited thereto.

A buffer layer 111 is positioned between the transistor layer and the substrate 110. A metal layer 135, which serves as a light shield, is disposed between the substrate 110 and the buffer layer 111.

The passivation layer 114 and the planarization layer 115 are disposed on the transistor layer. The planarization layer 115 is disposed on the passivation layer 114. The planarization layer 115 protects the driving transistor and planarizes an upper portion of the driving transistor.

A light-emitting element 120, which includes an anode electrode 121, an organic layer 122, and a cathode electrode 123, is disposed on the planarization layer 115. The anode electrode 121 may be electrically connected to the drain electrode 134 of the transistor through a contact hole provided in the passivation layer 114 and the planarization layer 115. The anode electrode 121 may be made of a metallic material.

Because the organic light-emitting display device 100 according to the exemplary embodiment of the present specification is a top emission type organic light-emitting display device in which light emitted from the light-emitting element 120 propagates toward a position above the substrate 110, the anode electrode 121 may further include a transparent conductive layer, and a reflective layer disposed on the transparent conductive layer. For example, the transparent conductive layer may be made of transparent conducting oxide such as ITO or IZO. For example, the reflective layer may be made of silver (Ag), aluminum (Al), gold (Au), molybdenum (Mo), tungsten (W), chromium (Cr), or an alloy thereof.

A bank 116 is disposed on the planarization layer 115 while covering an edge portion of the anode electrode 121. A portion of the bank 116, which corresponds to a light-emitting area of the sub-pixel SP, may be removed. A part of the anode electrode 121 may be exposed by the removed portion of the bank 116. A part of an end portion of the anode electrode 121 may be in contact with an end portion of the bank 116. In this case, the bank 116 may be made of an inorganic insulating material such as silicon nitride (SiNx) or silicon oxide (SiOx), or an organic insulating material such as benzocyclobutene-based resin, acrylic resin, polyimide (PI)-based resin, or imide-based resin. However, the present disclosure is not limited thereto.

With reference to FIG. 2, the data line DL_B, the auxiliary line EVSS, and the data line DL_W are provided on the substrate 110 and disposed between the blue sub-pixel SP_B and the white sub-pixel SP_W. The auxiliary line EVSS is a low-potential voltage supply line, i.e., an auxiliary line electrically connected to a cathode electrode 123 in a contact area CNT and configured to reduce resistance of the cathode electrode 123.

Hereinafter, a structure of the contact area CNT, in which the cathode electrode 123 and the auxiliary line EVSS are in contact with each other, will be described in detail with reference to FIG. 3.

The auxiliary line EVSS may be disposed between the plurality of sub-pixels on the substrate 110. In this case, the auxiliary line EVSS may be disposed on the same layer and made of the same material as the metal layer 135. In addition, the data line DL_B and the data line DL_W are disposed on the same layer as the auxiliary line EVSS and disposed at two opposite sides of the auxiliary line EVSS.

The buffer layer 111 is disposed on the auxiliary line EVSS, and an auxiliary line connection part 125 connected to the auxiliary line EVSS is disposed on the buffer layer 111. The auxiliary line connection part 125 may include a first auxiliary line connection part 125-1 and a second auxiliary line connection part 125-2.

As an example, as illustrated in FIG. 3, the first auxiliary line connection part 125-1 may be made of the same material as the gate electrode 132, and the second auxiliary line connection part 125-2 may be made of the same material as the source electrode 133 and the drain electrode 134 of the transistor. Therefore, the first auxiliary line connection part 125-1 may be created together with the process procedure of the gate electrode 132 of the transistor. The second auxiliary line connection part 125-2 may be created together with the process procedure of the source electrode 133 and the drain electrode 134 of the transistor. Therefore, the process procedure may be easily performed, and costs may be reduced. As another example, the first auxiliary line connection part 125-1 may be disposed on the same layer and made of the same material as the gate electrode 132, the source electrode 133, and/or the drain electrode 134. The second auxiliary line connection part 125-2 may be disposed on a layer different from layers on which the gate electrode 132, the source electrode 133, and the drain electrode 134 are disposed. The second auxiliary line connection part 125-2 may be made of a material different from materials of the gate electrode 132, the source electrode 133, and the drain electrode 134. In this case, the second auxiliary line connection part 125-2 may be made of a molybdenum titanium alloy (MoTi) strong against oxidation.

The first auxiliary line connection part 125-1 is disposed on the buffer layer 111, the interlayer insulation layer 112 is disposed on the first auxiliary line connection part 125-1, and the second auxiliary line connection part 125-2 is disposed on the interlayer insulation layer 112. The first auxiliary line connection part 125-1 is connected to the auxiliary line EVSS through a contact hole provided in the buffer layer 111, and the second auxiliary line connection part 125-2 is connected to the first auxiliary line connection part 125-1 through a contact hole provided in the interlayer insulation layer 112. In this case, the second auxiliary line connection part 125-2 may further be disposed to surround the plurality of sub-pixels.

The passivation layer 114 is disposed on the auxiliary line connection part 125. The passivation layer 114 exposes the auxiliary line connection part 125, i.e., one surface of an upper portion of the second auxiliary line connection part 125-2 in the contact area CNT.

The planarization layer 115 disposed on the passivation layer 114 may have an end that further protrudes toward the contact area CNT than an end of the passivation layer 114 in the contact area CNT. Therefore, in the contact area CNT, the planarization layer 115 and the passivation layer 114 define a contact hole having an undercut structure UC.

In addition, in the contact area CNT, a dummy organic layer 122*a*, which is made of the same material as the organic layer 122 of the light-emitting element 120 of the sub-pixel, is disposed on an exposed surface of the second auxiliary line connection part 125-2. The dummy organic layer 122*a* is spaced apart from the organic layer 122 of the light-emitting element 120 of the sub-pixel. As described above, the dummy organic layer 122*a* which is formed on the contact area CNT and the organic layer 122 of the light-emitting element 120 are disconnected, such that a moisture transfer to the adjacent sub-pixel is suppressed even though moisture penetration occurs, thereby improving moisture penetration reliability. The light-emitting layer 122 of the light-emitting element 120 may be an organic light-emitting layer (i.e., an organic layer) and further include at least one function layer, among a hole transport layer, a hole injection layer, an electron transport layer, and an electron injection layer, in addition to the light-emitting layer that emits light with a particular color.

In the contact area CNT, the cathode electrode 123 is in contact with the dummy organic layer 122*a*, the second auxiliary line connection part 125-2, a side surface of the passivation layer 114, and a bottom surface of the planarization layer 115 that further protrudes than the passivation layer 114 (the undercut structure UC).

Therefore, the cathode electrode 123 may be electrically connected to the auxiliary line EVSS disposed between the sub-pixels, thereby providing uniform resistance of the cathode electrode 123 over the entire display area DA.

Although not illustrated in FIG. 3, a sealing layer may be positioned above the cathode electrode 123. The sealing layer may have a single layer structure or a multilayer structure including an organic film and an inorganic film. In addition, although not illustrated, a color filter and/or a touch detection layer may be disposed on the sealing layer.

Figure 4:
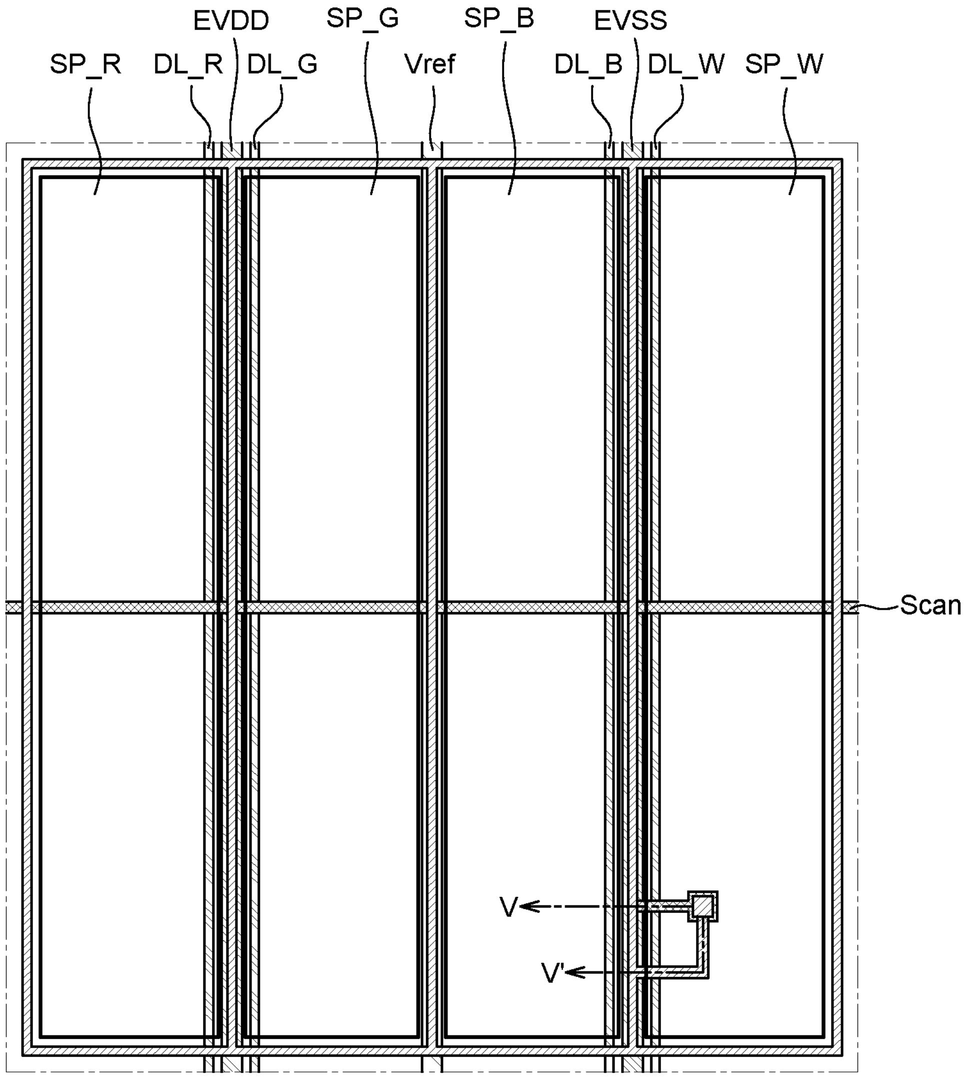
FIG. 4 is a top plan view for explaining a contact structure between a cathode electrode and an auxiliary line of an organic light-emitting display device according to another exemplary embodiment of the present specification.
Figure 5:
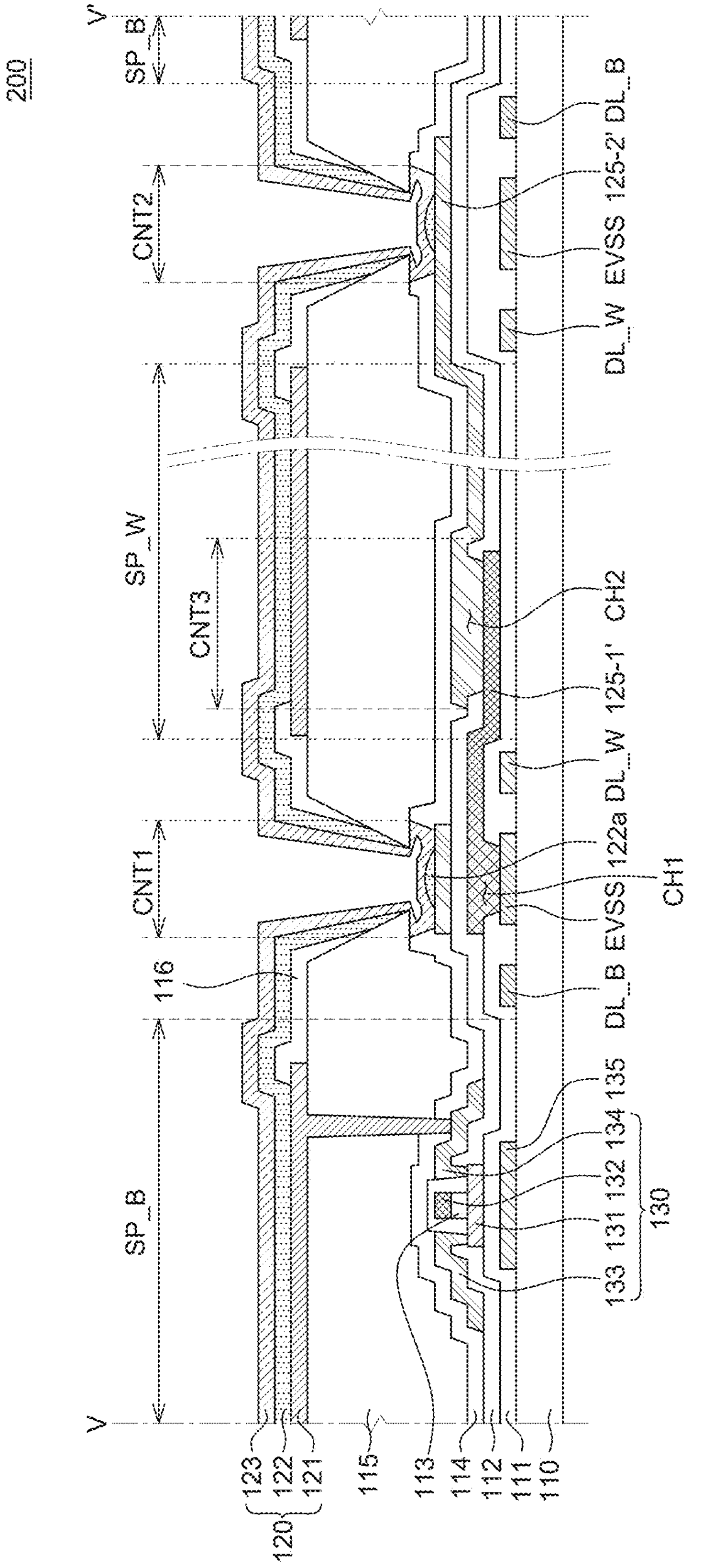
FIG. 5 is a cross-sectional view taken along line V-V' in FIG. 4 according to an exemplary embodiment of the present specification.

FIG. 4 is a top plan view for explaining a contact structure between a cathode electrode and an auxiliary line of an organic light-emitting display device according to another exemplary embodiment of the present specification. FIG. 5 is a cross-sectional view taken along line V-V' in FIG. 4.

FIGS. 2 and 3 illustrate that the contact area CNT, in which the cathode electrode 123 and the auxiliary line EVSS are in contact with each other, is formed between the plurality of sub-pixels, i.e., on the auxiliary line EVSS.

In this case, because a plurality of contact holes for the buffer layer 111, the interlayer insulation layer 112, and the passivation layer 114 need to be formed in a limited space between the sub-pixels, there may be a limitation to an area of the contact area CNT and a process of creating the contact area CNT.

Therefore, as illustrated in FIG. 4, the organic light-emitting display device 100 according to another exemplary embodiment of the present specification adopts a contact structure such as the contact area CNT, in which the cathode electrode 123 and the auxiliary line EVSS are in contact with each other, is formed through an area in which the auxiliary line EVSS is disposed and a partial area of the sub-pixel adjacent to the auxiliary line EVSS.

With reference to FIG. 5, the auxiliary line EVSS is disposed between the blue sub-pixel SP_B and the white sub-pixel SP_W, and the transistor layer and the light-emitting element 120, which have structures identical to the structure in FIG. 3, are disposed in an area of the blue sub-pixel.

Meanwhile, as illustrated in FIG. 5, in an organic light-emitting display device 200 according to another exemplary embodiment of the present specification, areas, in which the cathode electrode 123 and the auxiliary line EVSS are in contact with each other, may be respectively disposed in an upper portion of the auxiliary line EVSS and a part of an area of the sub-pixel (illustrated as the white sub-pixel SP_W in FIG. 5) adjacent to the auxiliary line EVSS.

First, a structure in which the auxiliary line EVSS and a first auxiliary line connection part 125-1' are connected above the auxiliary line EVSS will be described.

The auxiliary line EVSS is provided on the substrate 110 and disposed between the plurality of sub-pixels. The buffer layer 111 is disposed on the auxiliary line EVSS, and the first auxiliary line connection part 125-1', which is connected to the auxiliary line EVSS, is disposed on the buffer layer 111. The interlayer insulation layer 112 is disposed on the first auxiliary line connection part 125-1', and a second auxiliary line connection part 125-2' is disposed on the interlayer insulation layer 112.

However, unlike the contact structure illustrated in FIG. 3, the first auxiliary line connection part 125-1' is connected to the auxiliary line EVSS through the contact hole CH1 provided in the buffer layer 111, but no separate contact hole is formed in the interlayer insulation layer 112. That is, the second auxiliary line connection part 125-2' and the first auxiliary line connection part 125-1' are not connected directly to each other while overlapping each other on the auxiliary line EVSS. In this case, the first auxiliary line connection part 125-1' is disposed on the buffer layer 111 and extends to a partial area of the adjacent sub-pixel.

Further, the contact area CNT (illustrated as a first contact area CNT1 and a second contact area CNT2 in FIG. 5), which has an undercut structure described above with reference to FIG. 3, is formed on the second auxiliary line connection part 125-2'. In the contact area CNT (i.e., in each of the first contact area CNT1 and the second contact area CNT2), the cathode electrode 123 and the second auxiliary line connection part 125-2' are connected in an area in which the second auxiliary line connection part 125-2' is exposed.

Next, a structure in which the first auxiliary line connection part 125-1' and the second auxiliary line connection part 125-2' are connected in the partial area of the sub-pixel adjacent to the auxiliary line EVSS will be described.

In a third contact area CNT3, which is the partial area of the adjacent sub-pixel (illustrated as the white sub-pixel SP_W in FIG. 5) in which the first auxiliary line connection part 125-1' is disposed while extending, the second auxiliary line connection part 125-2' disposed on the interlayer insulation layer 112 is electrically connected to the first auxiliary line connection part 125-1' through a contact hole CH2 provided in the interlayer insulation layer 112.

In this case, the second auxiliary line connection part 125-2' is disposed to extend from the third contact area CNT3 in the area of the white sub-pixel SP_W adjacent to the auxiliary line EVSS to the second contact area CNT2 on the auxiliary line EVSS. The second contact area CNT2 overlaps the auxiliary line EVSS and is spaced apart from the first contact area CNT1 where the first auxiliary line connection part 125-1' and the auxiliary line EVSS are in contact.

As described above, the second contact area CNT2, which has an undercut structure described above with reference to FIG. 3, is formed on the second auxiliary line connection part 125-2'. In the second contact area CNT2, the cathode electrode 123 and the second auxiliary line connection part 125-2' are connected in the area in which the second auxiliary line connection part 125-2' is exposed.

The first contact area CNT1, in which the first auxiliary line connection part 125-1' and the auxiliary line EVSS are connected, and the second contact area CNT2, in which the second auxiliary line connection part 125-2' and the cathode electrode 123 are connected, are spaced apart from each other in a direction in which the auxiliary line EVSS extends.

As illustrated in FIG. 5, in one position (i.e., CNT1) on the auxiliary line EVSS, the contact hole CH1 for connection between the auxiliary line EVSS and the first auxiliary line connection part 125-1' is formed in the buffer layer 111, but no contact hole is formed in the interlayer insulation layer 112. On another position (i.e., CNT2) spaced apart from the position (i.e., CNT1) on the auxiliary line EVSS, no separate contact hole for connection between the auxiliary line EVSS and the auxiliary line connection part 125 is formed. In addition, in one area (i.e., CNT3) of the sub-pixel adjacent to the auxiliary line EVSS, the contact hole CH2 for connection between the first auxiliary line connection part 125-1' and the second auxiliary line connection part 125-2' is formed in the interlayer insulation layer 112, but no separate contact hole for connection between the auxiliary line EVSS and the auxiliary line connection part 125 is formed in the buffer layer 111. Therefore, a reduced number of contact holes may be formed in the area in which the auxiliary line EVSS is disposed where the space is restrictive. In addition, in the area (i.e., the partial area of a subpixel adjacent to the auxiliary line EVSS) with relatively small space constraint compared to the area where the auxiliary line EVSS is disposed, the contact hole (i.e., CH2) for connection between the first and second auxiliary line connection parts 125-1' and 125-2' is formed, which may ensure a larger contact area between the first and second auxiliary line connection parts 125-1' and 125-2'. Therefore, contact resistance between the first and second auxiliary line connection parts 125-1' and 125-2' may be reduced, and a current density may be lowered, such that a problem with heat generation may be solved, and power consumption may be improved.

As described above with reference to FIG. 5, the auxiliary line EVSS is connected to the first auxiliary line connection part 125-1' in the first contact area CNT1, the first auxiliary line connection part 125-1' is connected to the second auxiliary line connection part 125-2' in the third contact area CNT3, and the cathode electrode 123 is connected to the second auxiliary line connection part 125-2' through a contact hole having the undercut structure formed in the planarization layer 115 in the second contact area CNT2. Therefore, the cathode electrode 123 and the auxiliary line EVSS are electrically connected through the auxiliary line connection parts 125-1' and 125-2'.

Hereinafter, various undercut structures of the contact area CNT having the contact hole in the organic light-emitting display device 100 according to the exemplary embodiments of the present specification will be described in detail with reference to FIGS. 6A to 10F.

FIGS. 6A to 6F are cross-sectional views for explaining a process procedure of the contact structure between the cathode electrode and the auxiliary line of the organic light-emitting display device in FIG. 4.

FIGS. 6A to 6F illustrate the second contact area CNT2 in which the second auxiliary line connection part 125-2' and the cathode electrode 123 are in contact with each other on the auxiliary line EVSS in FIG. 5. However, the process procedure in FIGS. 6A to 6F may be equally applied to the first contact area CNT1 in which the second auxiliary line connection part 125-2' and the cathode electrode 123 are in contact with each other on the position at which the first auxiliary line connection part 125-1' and the auxiliary line EVSS are connected. In addition, the process procedure in FIGS. 6A to 6F may also be equally applied to the contact area CNT described with reference to FIGS. 2 and 3.

Figure 6A:
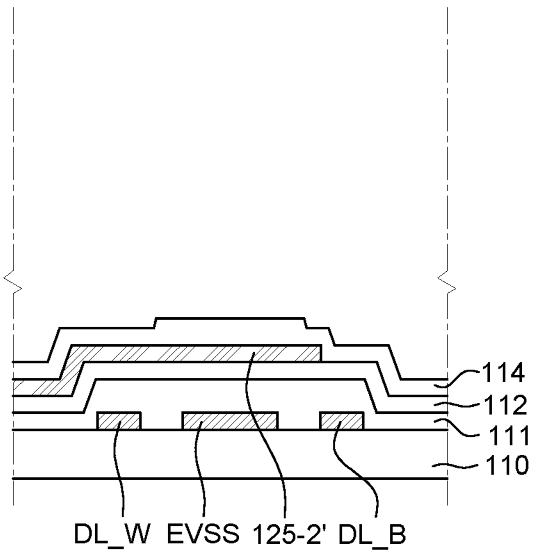
FIGS. 6A to 6F are cross-sectional views for explaining a process procedure of the contact structure between the cathode electrode and the auxiliary line of the organic light-emitting display device in FIG. 4 according to an exemplary embodiment of the present specification.

As illustrated in FIG. 6A, the data line DL_W and DL_B and the auxiliary line EVSS are disposed on the substrate 110, the buffer layer 111 is disposed on the auxiliary line EVSS, the interlayer insulation layer 112 is disposed on the buffer layer 111, and the second auxiliary line connection part 125-2' and the passivation layer 114 are sequentially disposed on the interlayer insulation layer 112.

Figure 6B:
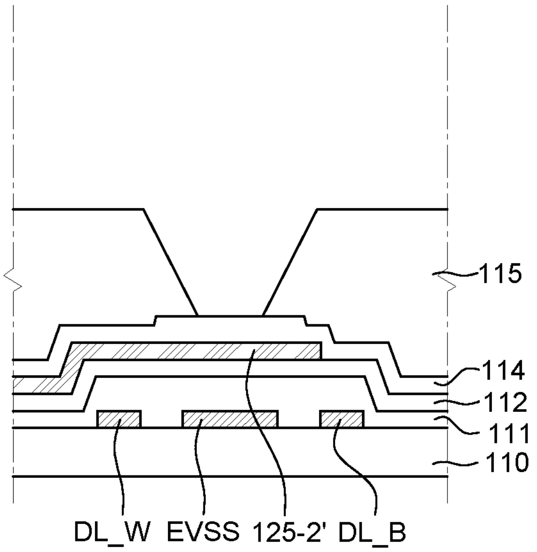

Then, as illustrated in FIG. 6B, the planarization layer 115 is disposed on the passivation layer 114, and the planarization layer 115 has an open area in which a part of the passivation layer 114 is exposed.

Figure 6C:
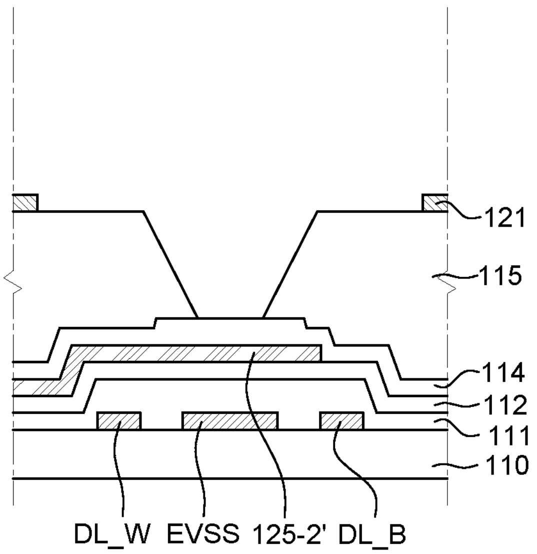
Figure 6D:
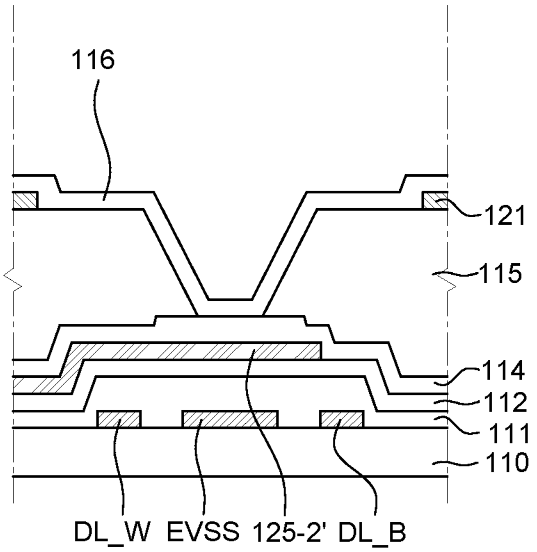

Next, as illustrated in FIG. 6C, the anode electrode 121 of the light-emitting element 120 is disposed on the planarization layer 115. As illustrated in FIG. 6D, the bank 116 is disposed on the planarization layer 115 so as to cover the anode electrode 121. In this case, the bank 116 may be made of an inorganic material.

Figure 6E:
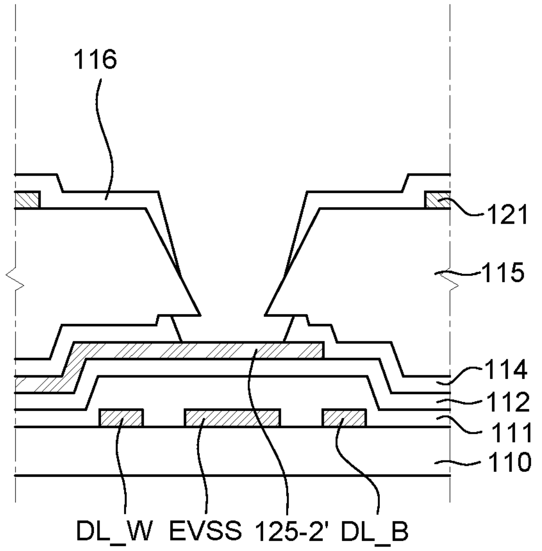

Then, as illustrated in FIG. 6E, the contact hole is formed by etching the bank 116, the planarization layer 115, and the passivation layer 114 so that a part of the second auxiliary line connection part 125-2' is exposed. In this case, the shape of the contact hole has an undercut structure in which an end of the planarization layer 115 disposed on the passivation layer 114 further protrudes toward the contact hole than an end of the passivation layer 114. Isotropic and anisotropic dry etching processes and a high-concentration BOE process may be performed to form the contact hole having the undercut structure. In addition, the planarization layer 115 may have a thickness (e.g., 8000 Å) sufficient to form the contact area CNT.

Figure 6F:
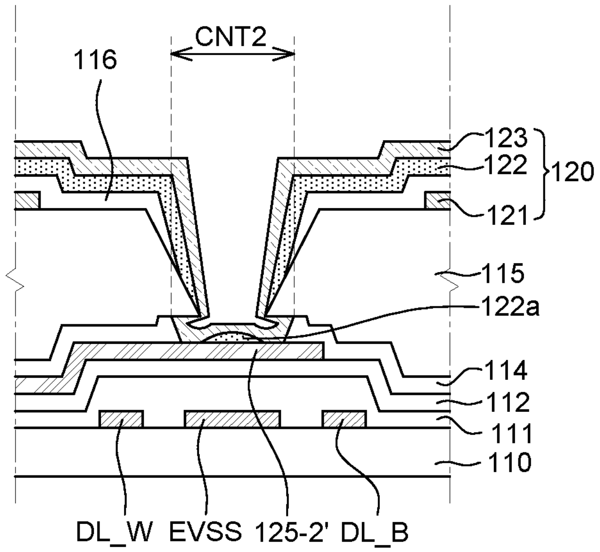

Next, as illustrated in FIG. 6F, the organic layer 122 and the cathode electrode 123 of the light-emitting element 120 are sequentially deposited. Therefore, the dummy organic layer 122*a*, which is made of the same material as the organic layer 122, is deposited in a partial area (i.e., central area) on the second auxiliary line connection part 125-2' exposed through the contact hole having the undercut structure. The cathode electrode 123 is deposited on a peripheral area of the dummy organic layer 122*a*, i.e., a lower area of the planarization layer 115 defined by the undercut structure and deposited on the organic layer 122 formed along the side surface of the contact hole. That is, in the contact area CNT, the cathode electrode 123 is in contact with the dummy organic layer 122*a*, the second auxiliary line connection part 125-2', the side surface of the passivation layer 114, and the bottom surface of the planarization layer 115 that further protrudes than the passivation layer 114.

As described above, the undercut structure is formed in the bank 116 and the planarization layer 115, which are made of an inorganic material, at the time of forming the contact hole in the second contact area CNT2. Therefore, there occurs no problem of tearing, pealing or otherwise detaching, unlike the anode electrode 121 formed when an undercut structure is formed by using a layer of the anode electrode 121. Therefore, it is possible to suppress a cleaning defect and a defect caused by foreign substances and form a stable undercut structure.

Figure 7:
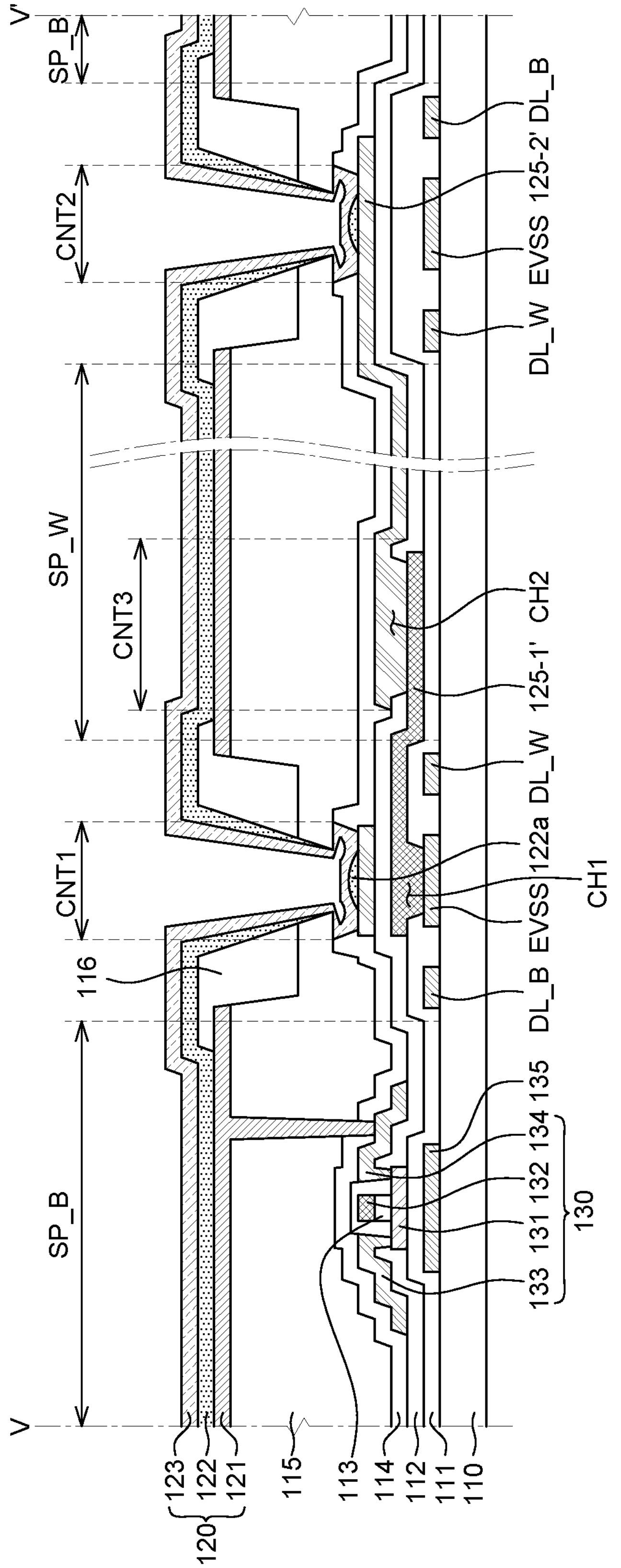
FIG. 7 is a cross-sectional view for explaining a contact structure between a cathode electrode and an auxiliary line of an organic light-emitting display device according to still another exemplary embodiment of the present specification.

FIG. 7 is a cross-sectional view for explaining a contact structure between a cathode electrode and an auxiliary line of an organic light-emitting display device according to still another exemplary embodiment of the present specification.

FIGS. 8A to 8G are cross-sectional views for explaining a process procedure of the contact structure between the cathode electrode and the auxiliary line of the organic light-emitting display device in FIG. 7.

In FIGS. 6A to 6F described above, the bank 116 made of an inorganic material is used to form the contact hole having the undercut structure in the first contact area CNT1 and the second contact area CNT2.

In contrast, in the first contact area CNT1 and the second contact area CNT2 illustrated in FIG. 7, a stepped portion is formed on the planarization layer 115, and the bank 116 made of an organic material is disposed on the stepped portion of the planarization layer 115, which makes it possible to inhibit the bank 116 from being filled during the process procedure.

FIGS. 8A to 8G illustrate the second contact area CNT2 in which the second auxiliary line connection part 125-2' and the cathode electrode 123 are in contact with each other on the auxiliary line EVSS in FIG. 7. However, the process procedure in FIGS. 8A to 8G may be equally applied to the first contact area CNT1 in which the second auxiliary line connection part 125-2' and the cathode electrode 123 are in contact with each other on the position at which the first auxiliary line connection part 125-1' and the auxiliary line EVSS are connected. In addition, the process procedure in FIGS. 8A to 8G may also be equally applied to the contact area CNT described with reference to FIGS. 2 and 3.

Figure 8A:
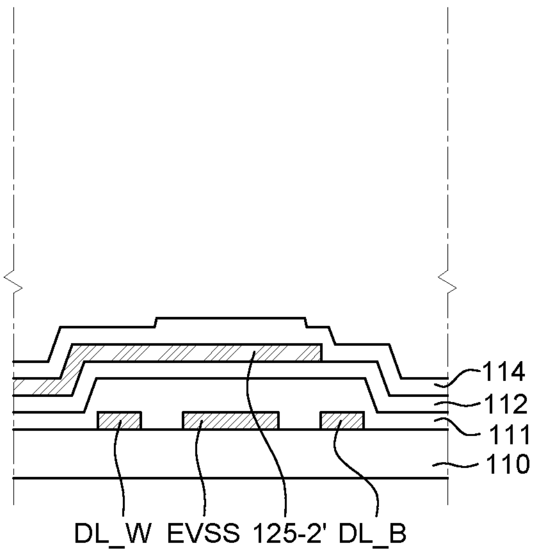
FIGS. 8A to 8G are cross-sectional views for explaining a process procedure of the contact structure between the cathode electrode and the auxiliary line of the organic light-emitting display device in FIG. 7 according to an exemplary embodiment of the present specification.

As illustrated in FIG. 8A, the data line DL_W and DL_B and the auxiliary line EVSS are disposed on the substrate 110, the buffer layer 111 is disposed on the auxiliary line EVSS, the interlayer insulation layer 112 is disposed on the buffer layer 111, and the second auxiliary line connection part 125-2' and the passivation layer 114 are sequentially disposed on the interlayer insulation layer 112.

Figure 8B:
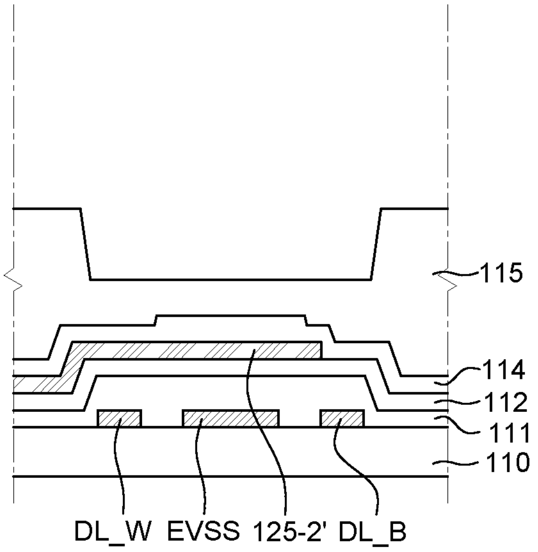

Then, as illustrated in FIG. 8B, the planarization layer 115 is disposed on the passivation layer 114, and the planarization layer 115 has a stepped portion (which may be formed using photoresist) so that a portion corresponding to an area, in which the contact hole of the second contact area CNT2 is to be formed, is lower than the other area.

Figure 8C:
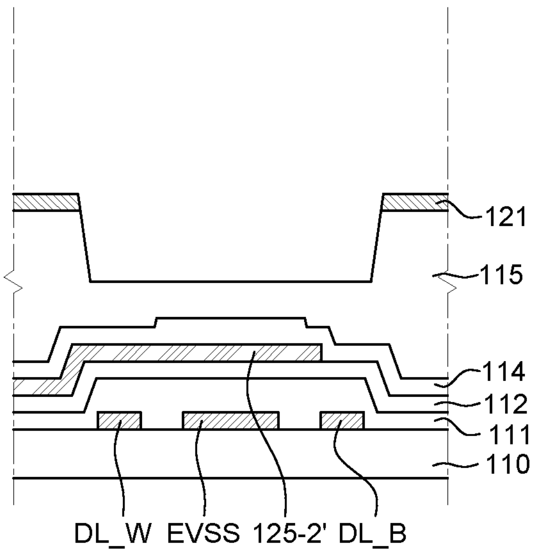

Next, as illustrated in FIG. 8C, the anode electrode 121 of the light-emitting element 120 is formed on the planarization layer 115. Therefore, the planarization layer 115 includes a first part configured to overlap the anode electrode 121 of the light-emitting element 120, and a second part extending from the first part to the second contact area CNT2 and having a smaller thickness than the first part.

Figure 8D:
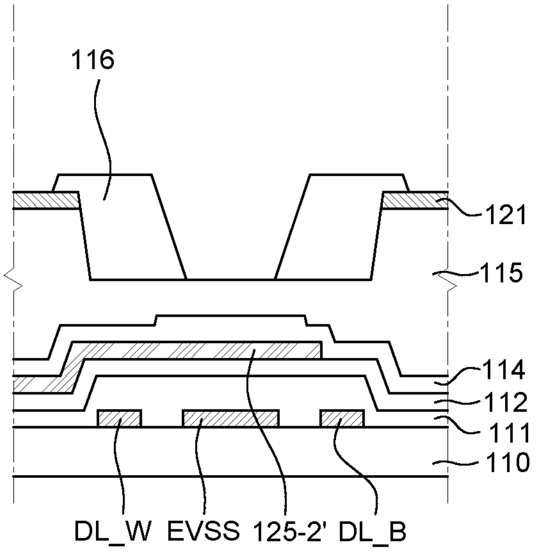

Next, as illustrated in FIG. 8D, the bank 116, which is made of an organic material such as polyimide, is formed on the planarization layer 115 and the anode electrode 121. In this case, an end of the bank 116 is disposed on the second part of the planarization layer 115.

Figure 8E:
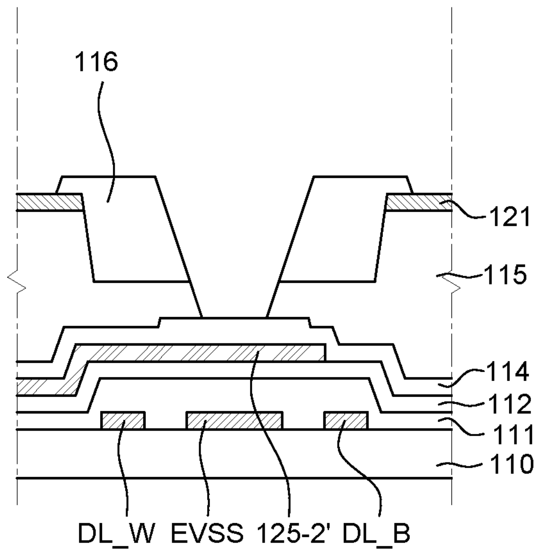

Then, as illustrated in FIG. 8E, the contact hole is formed by etching the bank 116 and the planarization layer 115 so that a part of the passivation layer 114 is exposed.

Figure 8F:
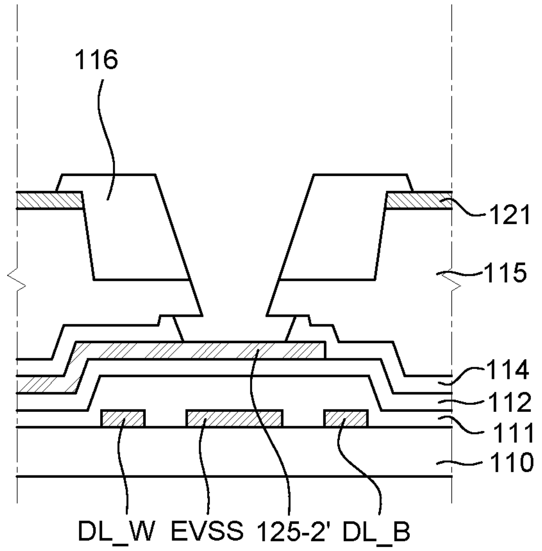

Further, as illustrated in FIG. 8F, the contact hole is formed by etching the passivation layer 114 so that a part of the second auxiliary line connection part 125-2' is exposed. In this case, the shape of the contact hole has the undercut structure in which the end of the planarization layer 115 disposed on the passivation layer 114 further protrudes toward the contact hole than the end of the passivation layer 114. The isotropic and anisotropic dry etching processes and the high-concentration BOE process may be performed to form the contact hole having the undercut structure. In addition, the planarization layer 115 may have a thickness (e.g., 8000 Å) sufficient to form the second contact area CNT2.

Figure 8G:
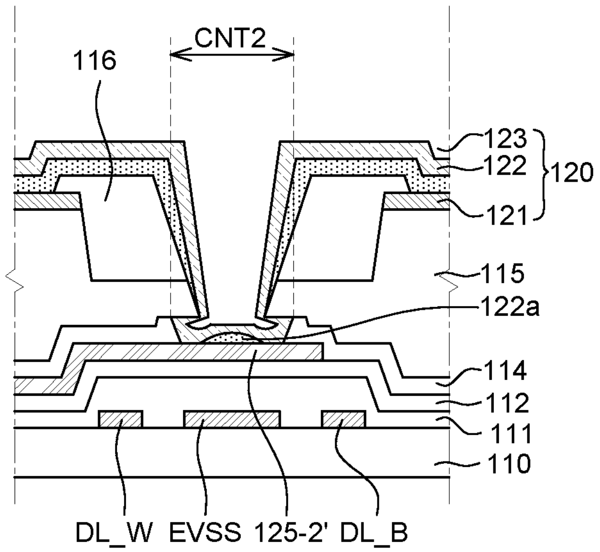

Next, as illustrated in FIG. 8G, the organic layer 122 and the cathode electrode 123 of the light-emitting element 120 are sequentially deposited. Therefore, the dummy organic layer 122*a*, which is made of the same material as the organic layer 122, is deposited in a partial area (i.e., central area) on the second auxiliary line connection part 125-2' exposed through the contact hole having the undercut structure. The cathode electrode 123 is deposited on the peripheral area of the dummy organic layer 122*a*, i.e., the lower area of the planarization layer 115 defined by the undercut structure and deposited on the organic layer 122 formed along the side surface of the contact hole. That is, in the second contact area CNT2, the cathode electrode 123 is in contact with the dummy organic layer 122*a*, the second auxiliary line connection part 125-2', the side surface of the passivation layer 114, and the bottom surface of the planarization layer 115 that further protrudes than the passivation layer 114.

As described above, to form the contact hole in the second contact area CNT2, the bank 116 made of an organic material may be used to form the undercut structure.

Figure 9:
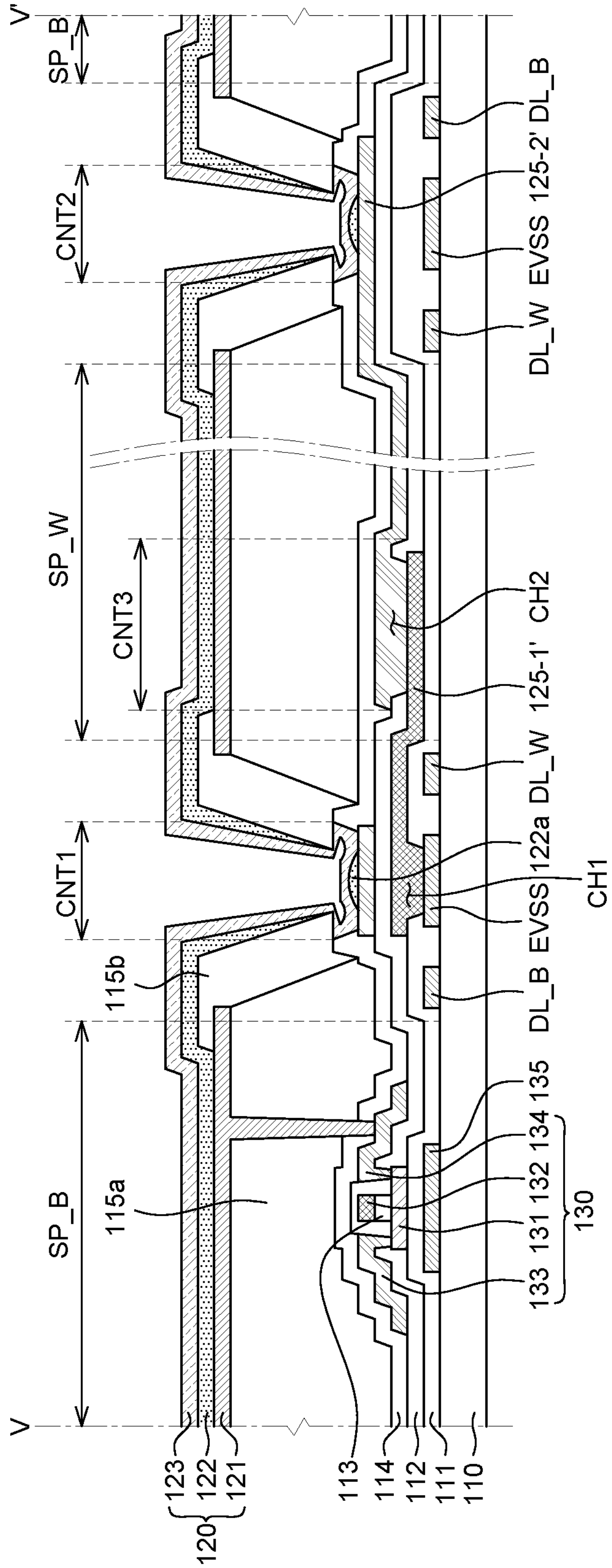
FIG. 9 is a cross-sectional view for explaining a contact structure between a cathode electrode and an auxiliary line of an organic light-emitting display device according to yet another exemplary embodiment of the present specification.

FIG. 9 is a cross-sectional view for explaining a contact structure between a cathode electrode and an auxiliary line of an organic light-emitting display device according to yet another exemplary embodiment of the present specification.

FIGS. 10A to 10F are cross-sectional views for explaining a process procedure of the contact structure between the cathode electrode and the auxiliary line of the organic light-emitting display device in FIG. 9.

In the first contact area CNT1 and the second contact area CNT2 illustrated in FIG. 9, the undercut structure is formed by using the plurality of planarization layers 115*a* and 115*b*. Therefore, instead of the bank 116 made of an organic or inorganic material having a low bonding force to the planarization layer 115 in the first contact area CNT1 and the second contact area CNT2 described above with reference to FIGS. 7 and 8A-8G, the planarization layer 115*b*, which is made of the same material as the planarization layer 115*a*, may be used to ensure a higher bonding force.

FIGS. 10A to 10F illustrate the second contact area CNT2 in which the second auxiliary line connection part 125-2' and the cathode electrode 123 are in contact with each other on the auxiliary line EVSS in FIG. 9. However, the process procedure in FIGS. 10A to 10F may be equally applied to the first contact area CNT1 in which the second auxiliary line connection part 125-2' and the cathode electrode 123 are in contact with each other on the position at which the first auxiliary line connection part 125-1' and the auxiliary line EVSS are connected. In addition, the process procedure in FIGS. 10A to 10F may also be equally applied to the contact area CNT described with reference to FIGS. 2 and 3.

Figure 10A:
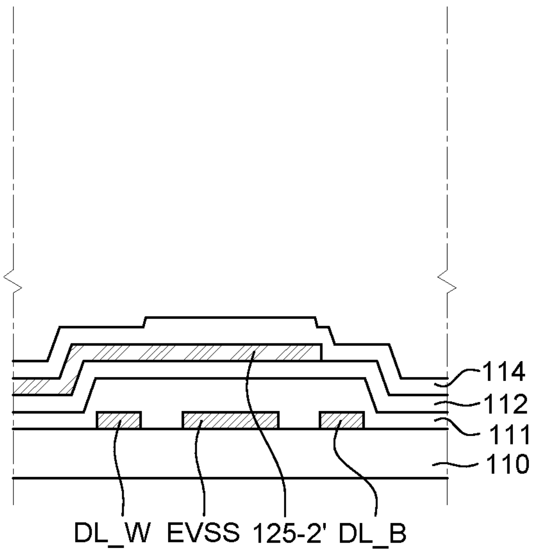
FIGS. 10A to 10F are cross-sectional views for explaining a process procedure of the contact structure between the cathode electrode and the auxiliary line of the organic light-emitting display device in FIG. 9 according to an exemplary embodiment of the present specification.

As illustrated in FIG. 10A, the data line DL_W and DL_B and the auxiliary line EVSS are disposed on the substrate 110, the buffer layer 111 is disposed on the auxiliary line EVSS, the interlayer insulation layer 112 is disposed on the buffer layer 111, and the second auxiliary line connection part 125-2' and the passivation layer 114 are sequentially disposed on the interlayer insulation layer 112.

Figure 10B:
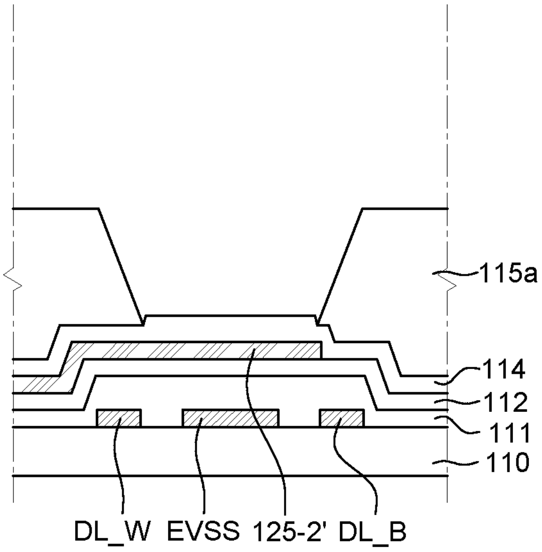

Then, as illustrated in FIG. 10B, a first planarization layer 115*a* is disposed on the passivation layer 114, and the first planarization layer 115*a* has an open area in which a part of the passivation layer 114 is exposed.

Figure 10C:
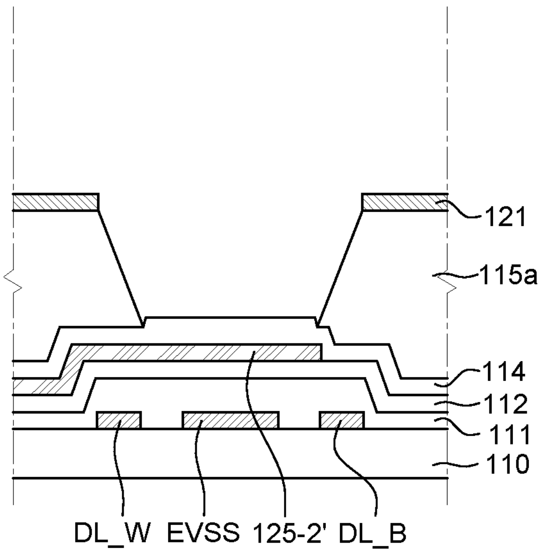
Figure 10D:
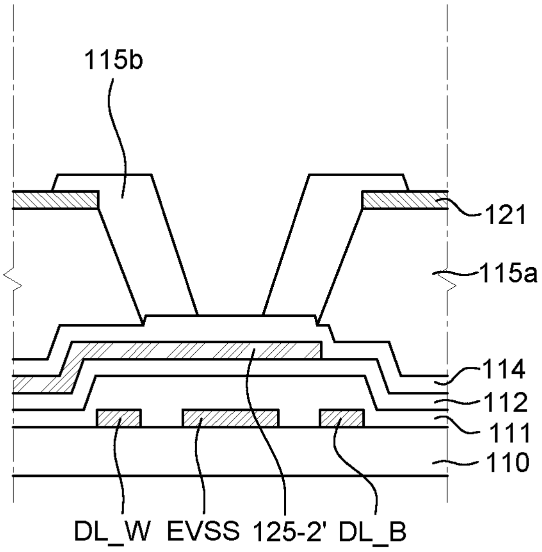

Next, as illustrated in FIG. 10C, the anode electrode 121 of the light-emitting element 120 is disposed on the first planarization layer 115*a*. As illustrated in FIG. 10D, a second planarization layer 115*b*, which is made of the same material as the first planarization layer 115*a*, is disposed on the first planarization layer 115*a* and the anode electrode 121 so as to cover the end of the anode electrode 121 and the first planarization layer 115*a*. In this case, the first planarization layer 115*a* and the second planarization layer 115*b* may each be made of photo acrylic.

Figure 10E:
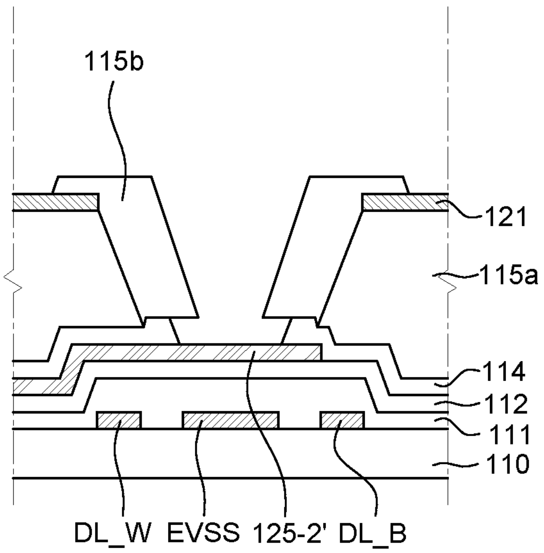

Then, as illustrated in FIG. 10E, the contact hole is formed by etching the first planarization layer 115*a* and the second planarization layer 115*b* so that a part of the second auxiliary line connection part 125-2' is exposed. In this case, a shape of the contact hole has an undercut structure in which an end of the second planarization layer 115*b* further protrudes toward the contact hole than an end of the passivation layer 114 and an end of the first planarization layer 115*a*. The isotropic and anisotropic dry etching processes and the high-concentration BOE process may be performed to form the contact hole having the undercut structure. In addition, the first planarization layer 115*a* may have a thickness (e.g., 8000 Å) sufficient to form the second contact area CNT2.

Figure 10F:
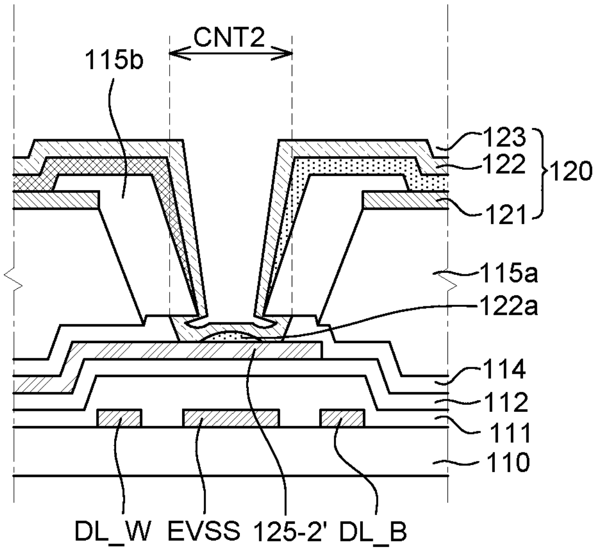

Next, as illustrated in FIG. 10F, the organic layer 122 and the cathode electrode 123 of the light-emitting element 120 are sequentially deposited. Therefore, the dummy organic layer 122*a*, which is made of the same material as the organic layer 122, is deposited in a partial area (i.e., central area) on the second auxiliary line connection part 125-2' exposed through the contact hole having the undercut structure. The cathode electrode 123 is deposited on the peripheral area of the dummy organic layer 122*a*, i.e., a lower area of the second planarization layer 115*b* defined by the undercut structure and deposited on the organic layer 122 formed along the side surface of the contact hole. That is, in the second contact area CNT2, the cathode electrode 123 is in contact with the dummy organic layer 122*a*, the second auxiliary line connection part 125-2', the side surface of the passivation layer 114, and the bottom surface of the second planarization layer 115*b* that further protrudes than the passivation layer 114 and the first planarization layer 115*a*.

As described above, to form the contact hole in the second contact area CNT2, the second planarization layer 115*b*, which is made of the same material as the first planarization layer 115*a*, is used to form the undercut structure, which makes it possible to increase a bonding force and stably form the undercut structure.

The exemplary embodiments of the present disclosure can also be described as follows:

According to an example of the present disclosure, there is provided an organic light-emitting display device. The organic light-emitting display device includes a substrate including a display area including a plurality of sub-pixels, and a non-display area. The organic light-emitting display device further includes an auxiliary line provided on the substrate and disposed between the plurality of sub-pixels. The organic light-emitting display device further includes an auxiliary line connection part connected to the auxiliary line. The organic light-emitting display device further includes a passivation layer disposed on the auxiliary line connection part and configured to expose a part of the auxiliary line connection part in a contact area. The organic light-emitting display device further includes an interlayer insulation layer disposed between the auxiliary line and the passivation layer. The organic light-emitting display device further includes a planarization layer disposed on the passivation layer and has an end that further protrudes toward the contact area than an end of the passivation layer. The organic light-emitting display device further includes a plurality of organic light-emitting elements provided on the planarization layer and disposed on the plurality of sub-pixels. The auxiliary line connection part includes: a first auxiliary line connection part disposed below the interlayer insulation layer and connected to the auxiliary line: and a second auxiliary line connection part disposed between the interlayer insulation layer and the passivation layer and connected to the first auxiliary line connection part. A cathode electrode of each of the plurality of organic light-emitting elements is in contact with the auxiliary line connection part in the contact area.

The organic light-emitting display device may further include a dummy organic layer disposed on the auxiliary line connection part. The dummy organic layer may be spaced apart from an organic layer of each of the plurality of organic light-emitting elements.

In the contact area, the cathode electrode may be in contact with the dummy organic layer, the auxiliary line connection part, a side surface of the passivation layer, and a bottom surface of the planarization layer that further protrudes from the passivation layer.

The organic light-emitting display device may further include a bank made of an inorganic material and configured to cover the planarization layer and an end of an anode electrode of each of the plurality of organic light-emitting elements. An end of the planarization layer may further protrude than an end of the bank in the contact area.

The organic light-emitting display device may further include a bank made of an organic material and configured to cover the planarization layer and an end of an anode electrode of each of the plurality of organic light-emitting elements. The planarization layer may include: a first part configured to overlap the anode electrode of each of the plurality of organic light-emitting elements: and a second part extending from the first part to the contact area and having a smaller thickness than the first part. An end of the bank may be disposed on the second part.

The bank may be made of polyimide.

The planarization layer may include: a first planarization layer disposed below an anode electrode of each of the plurality of organic light-emitting elements; and a second planarization layer configured to cover an end of an anode of each of the plurality of organic light-emitting elements and an end of the first planarization layer, the second planarization layer being closer to the contact area than the first planarization layer to the contact area.

The first planarization layer and the second planarization layer may be made of the same material.

The first planarization layer and the second planarization layer may be each made of photo acrylic.

The organic light-emitting display device further include a buffer layer disposed on the substrate. The auxiliary line may be disposed between the substrate and the buffer layer. The first auxiliary line connection part may be disposed between the buffer layer and the interlayer insulation layer.

The organic light-emitting display device further include a plurality of transistors disposed on the plurality of sub-pixels. The first auxiliary line connection part may be made of the same material as a gate electrode of each of the plurality of transistors. The second auxiliary line connection part may be made of the same material as a source electrode and a drain electrode of each of the plurality of transistors.

The plurality of sub-pixels may include a first sub-pixel and a second sub-pixel. The auxiliary line and the auxiliary line connection part may be disposed between the first sub-pixel and the second sub-pixel.

The plurality of sub-pixels may include a first sub-pixel and a second sub-pixel. The first auxiliary line connection part may be connected to the auxiliary line in an area that overlaps the auxiliary line. The first auxiliary line connection part may be disposed to extend to at least one of the first sub-pixel and the second sub-pixel. The second auxiliary line connection part may be connected to the first auxiliary line connection part at an extension portion of the first auxiliary line connection part and extends from the first auxiliary line connection part to the auxiliary line.

The second auxiliary line connection part may be further disposed to surround the plurality of sub-pixels.

Although examples of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but are not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light-emitting display device comprising:

a substrate including a display area having a plurality of sub-pixels, and a non-display area;

an auxiliary line on the substrate between the plurality of sub-pixels;

an auxiliary line connection part connected to the auxiliary line;

a passivation layer on the auxiliary line connection part, the passivation layer configured to expose a part of the auxiliary line connection part in a contact area;

an interlayer insulation layer between the auxiliary line and the passivation layer;

a planarization layer on the passivation layer, the planarization layer having an end that further protrudes toward the contact area than an end of the passivation layer;

a plurality of organic light-emitting elements on the planarization layer and on the plurality of sub-pixels; and a bank comprising an inorganic material, the bank configured to cover the planarization layer and an end of an anode electrode of each of the plurality of organic light-emitting elements, an end of the planarization layer protruding further than an end of the bank in the contact area, wherein the auxiliary line connection part comprises:

a first auxiliary line connection part below the interlayer insulation layer, the first auxiliary line connection part connected to the auxiliary line; and a second auxiliary line connection part between the interlayer insulation layer and the passivation layer, the second auxiliary line connection part connected to the first auxiliary line connection part, wherein a cathode electrode of each of the plurality of organic light-emitting elements is in contact with the auxiliary line connection part in the contact area.

2. The organic light-emitting display device of claim 1, further comprising:

a dummy organic layer on the auxiliary line connection part, wherein the dummy organic layer is spaced apart from an organic layer of each of the plurality of organic light-emitting elements.

3. The organic light-emitting display device of claim 2, wherein in the contact area, the cathode electrode is in contact with the dummy organic layer, the auxiliary line connection part, a side surface of the passivation layer, and a bottom surface of the planarization layer that protrudes further than the passivation layer.

4. The organic light-emitting display device of claim 1, further comprising:

a buffer layer on the substrate, wherein the auxiliary line is between the substrate and the buffer layer, and wherein the first auxiliary line connection part is between the buffer layer and the interlayer insulation layer.

5. The organic light-emitting display device of claim 4, further comprising:

a plurality of transistors on the plurality of sub-pixels, wherein the first auxiliary line connection part comprises a same material as a gate electrode of each of the plurality of transistors, wherein the second auxiliary line connection part comprises a same material as a source electrode and a drain electrode of each of the plurality of transistors.

6. The organic light-emitting display device of claim 4, wherein the plurality of sub-pixels comprise a first sub-pixel and a second sub-pixel, and the auxiliary line and the auxiliary line connection part are between the first sub-pixel and the second sub-pixel.

7. The organic light-emitting display device of claim 4, wherein the plurality of sub-pixels comprises a first sub-pixel and a second sub-pixel, wherein the first auxiliary line connection part is connected to the auxiliary line in an area that overlaps the auxiliary line, wherein the first auxiliary line connection part extends to at least one of the first sub-pixel and the second sub-pixel, wherein the second auxiliary line connection part is connected to the first auxiliary line connection part at an extension portion of the first auxiliary line connection part and extends from the first auxiliary line connection part to the auxiliary line.

8. The organic light-emitting display device of claim 7, wherein the second auxiliary line connection part surrounds the plurality of sub-pixels.

* * * * *